US011062934B2

(12) United States Patent
Volz et al.

(10) Patent No.: US 11,062,934 B2
(45) Date of Patent: Jul. 13, 2021

(54) VACUUM CHUCK FOR CLAMPING WORKPIECES, MEASURING DEVICES AND METHOD FOR CHECKING WORKPIECES, IN PARTICULAR WAFERS

(71) Applicant: Helmut Fischer GmbH Institut für Elektronik und Messtechnik, Sindelfingen (DE)

(72) Inventors: Werner Volz, Sindelfingen (DE); Paul Boos, Bodelshausen (DE)

(73) Assignee: Helmut Fischer GmbH Institut für Elektronik und Messtechnik, Sindelfingen (DE)

( * ) Notice: Subject to any disclaimer, the term of this patent is extended or adjusted under 35 U.S.C. 154(b) by 0 days.

(21) Appl. No.: 16/901,503

(22) Filed: Jun. 15, 2020

(65) Prior Publication Data

US 2020/0312701 A1 Oct. 1, 2020

Related U.S. Application Data

(63) Continuation of application No. 15/420,690, filed on Jan. 31, 2017, now Pat. No. 10,707,112.

(30) Foreign Application Priority Data

Feb. 3, 2016 (DE) ...................... 10 2016 101 842.2

(51) Int. Cl.
*H01L 21/683* (2006.01)
*H01L 21/687* (2006.01)
(Continued)

(52) U.S. Cl.
CPC ........ *H01L 21/6838* (2013.01); *B25B 11/005* (2013.01); *H01L 21/6779* (2013.01);
(Continued)

(58) Field of Classification Search
CPC ......... G01N 2223/30; G01N 2223/307; G01N 2223/309; G01N 2223/321; B25B 11/005;
(Continued)

(56) References Cited

U.S. PATENT DOCUMENTS 8,605,250 B2 * 12/2013 Seltmann ............. G03F 7/7085
355/53
8,690,135 B2 * 4/2014 Vekstein ............. H01L 21/6875
269/21

(Continued)

FOREIGN PATENT DOCUMENTS

DE 20 2013 102 800 U1 7/2013
WO 2013/031222 A1 3/2013
WO 2014/188572 A1 11/2014

*Primary Examiner* — Anastasia Midkiff
(74) *Attorney, Agent, or Firm* — Renner, Otto, Boisselle & Sklar, LLP (57) ABSTRACT

A vacuum chuck for clamping workpieces, in particular wafers, and a measuring device and a method for checking workpieces by way of X-ray fluorescent radiation. The vacuum chuck has a clamping plate having a support surface, having at least one suction connection arranged on a base body for connecting to a negative-pressure device and for clamping the workpiece on the clamping plate by negative pressure received by the base body and having several suction grooves arranged in the clamping plate and are open towards the support surface. The support surface has concentric suction grooves having a suction opening to which a negative-pressure line is connected or which is connected to a work channel. Each suction groove having a separate negative pressure, which is separate to the adjacent suction groove, is selectively controlled by a control valve by a control for supplying the respective negative pressure in the respective suction groove.

20 Claims, 8 Drawing Sheets

(51) Int. Cl.
*H01L 21/677* (2006.01)
*B25B 11/00* (2006.01)
*H01L 21/67* (2006.01)
*G01N 23/223* (2006.01)

(52) U.S. Cl.
CPC .... H01L 21/67778 (2013.01); H01L 21/6875 (2013.01); H01L 21/68785 (2013.01); *G01N 23/223* (2013.01); *G01N 2223/309* (2013.01); *G01N 2223/321* (2013.01); *H01L 21/67259* (2013.01); *H01L 21/67766* (2013.01); *H01L 21/68728* (2013.01); *H01L 21/68742* (2013.01); *H01L 2221/68309* (2013.01); *H01L 2221/68318* (2013.01)

(58) Field of Classification Search
CPC ........... H01L 31/67288; H01L 31/6838; H01L 31/68728; H01L 31/68742; H01L 31/678; H01L 31/67242; H01L 31/67259; H01L 31/67265; H01L 31/673; H01L 31/67763; H01L 31/67766; H01L 31/67769; H01L 31/67778; H01L 31/67784; H01L 31/67779; H01L 31/68; H01L 31/683; H01L 31/687; H01L 31/68707; H01L 31/6875; H01L 31/68785; H01L 22/12; H01L 2221/67; H01L 2221/68304; H01L 2221/68309; H01L 2221/68318; H01L 21/67288; H01L 21/6838; H01L 21/68728; H01L 21/68742; H01L 21/678; H01L 21/67242; H01L 21/67259; H01L 21/67265; H01L 21/673; H01L 21/67763; H01L 21/67766; H01L 21/67769; H01L 21/67778; H01L 21/67784; H01L 21/67779; H01L 21/68; H01L 21/683; H01L 21/687; H01L 21/68707; H01L 21/6875; H01L 21/68785; H01J 37/20; H01J 2237/20; H01J 2237/2005–2006
See application file for complete search history.

(56) References Cited

U.S. PATENT DOCUMENTS

| | | |
|---|---|---|
| 10,707,112 B2 * | 7/2020 | Volz ................. G01N 23/223 |
| 2004/0218339 A1 | 11/2004 | Nakamura |
| 2010/0013169 A1 | 1/2010 | Monteen et al. |
| 2010/0200545 A1 | 8/2010 | Koelmel et al. |
| 2014/0209250 A1 | 7/2014 | Kawagoe |
| 2014/0253900 A1 | 9/2014 | Cornelissen et al. |
| 2015/0127133 A1 | 5/2015 | Budiman |
| 2015/0294893 A1 | 10/2015 | Reichart |

* cited by examiner

VACUUM CHUCK FOR CLAMPING WORKPIECES, MEASURING DEVICES AND METHOD FOR CHECKING WORKPIECES, IN PARTICULAR WAFERS

This application is a continuation of U.S. patent application Ser. No. 15/420,690 filed Jan. 31, 2017, which claims priority to German Application No. 10 2016 101 842.2 filed Feb. 3, 2016, all of which are hereby incorporated herein by reference.

The invention relates to a vacuum chuck for clamping workpieces, in particular wafers, and a measuring device for checking workpieces clamped by such a vacuum chuck and a method for checking a workpiece clamped on the vacuum chuck.

A vacuum chuck is known from DE 20 2013 102 800 U1 which comprises a support or clamping surface for loading and clamping a workpiece by means of negative pressure. A clamping plate having the support and clamping surface is received by a base body which comprises a suction connection for connecting to a negative-pressure device for applying the negative pressure in the suction opening. Such vacuum chucks have the disadvantage that several suction openings aligned in parallel to one another are mutually supplied with negative pressure by a negative-pressure line, whereby an increased performance of the negative-pressure device is required after the receiving and clamping of smaller workpieces.

A vacuum chuck for checking wafers is known from a press release by the company Horst Witte Gerätebau Barskamp KG in 21354 Bleckede from 2011. This vacuum chuck has a clamping surface made of a microporous material. Very thin workpieces are fixed by this microstructure in a non-level-dependent and damage-free manner. The clamping surface is divided into three switchable clamping regions for wafers of different sizes. This clamping plate consisting of a microporous material for a vacuum chuck, however, has the disadvantage that it is very sensitive during handling and the clamping function is impaired when adding to or displacing the surface. Furthermore, this can only be used to a limited extent. In addition, a high negative-pressure performance is also required by the microporous surface of the clamping surface in order to fix the workpieces on the clamping surface, if these do not completely cover the selected segment.

The object of the invention is to propose a vacuum chuck for clamping workpieces, in particular wafers, with which a simple and even clamping of the workpieces on a support surface of a clamping plate is enabled. Furthermore, the object of the invention is to propose a vacuum chuck for a measuring device for checking workpieces and a method for checking these workpieces by means of X-ray fluorescent radiation.

This object is solved by a vacuum chuck in which each suction groove in the support layer of the clamping plate having at least one separate negative pressure, which is separate to the adjacent suction groove, is selectively controlled by means of at least one control valve by a control for the application of the negative pressure in the respective suction groove. By doing so, corresponding control of the respective suction groove covered by the workpiece or covered suction grooves takes place depending on the size of the workpiece to be clamped, whereby a high degree of effectiveness or a reduced performance of a negative-pressure device are required in order to enable a secure clamping of the workpiece.

Preferably, the support surface has several concentric suction grooves having at least one suction opening, to which the negative-pressure line is connected or which is connected to a work channel. Particularly in the case of wafers, which have a circular shape, a suction groove correspondingly adjusted to the size is provided near to the outer edge region of the wafer by the circularly formed suction grooves. This enables a secure clamping. Thus, further suction grooves that are larger in diameter do not need to be supplied with negative pressure. Thus, energy can be successfully saved.

The vacuum chuck can preferably have a base plate made of a material for checking the workpieces, in particular wafers, by means of X-ray fluorescent radiation, the atomic number of said base plate being selected in such a way that, with primary radiation of an X-ray fluorescent measuring device aimed at the workpiece, a small amount of scattered radiation is produced and the energy of the fluorescent radiation is so small that it is absorbed into the material of the object being checked. Thus, a complete or almost complete absorption is advantageously provided.

Alternatively, the base plate can be selected from a material in which the atomic number is chosen in such a way that the primary X-ray radiation aimed at the workpiece produces a fluorescent radiation, in which in a range of 20% to 80% of the fluorescent radiation is absorbed into the material of the workpiece to be checked. Thus, the fluorescent radiation that is not absorbed can be used for evaluation when detecting the measuring signals using a detector.

A further preferred embodiment of the vacuum chuck provides that at least three lifting pins are provided in the base plate, which are moveable from a retracted position in or below the support surface of the clamping plate into an extended position. This enables, for example, the workpiece to be fitted onto the lifting pin at the beginning of the checking process, in particular by a handling device. Subsequently, the workpiece, after removing the handling device from the region of the lifting pins, can be gently positioned and placed on the support surface of the clamping plate by means of the lifting pins, in order to subsequently tension this workpiece. In the same way, gently raising the workpiece from the support surface by the lifting pins can take place after the checking in order to subsequently enable a manual removal or an automatic removal.

The lifting pins preferably have a support surface that is similar to a suction cup or a receiving element having a central hole, which is connected to a negative-pressure line or a suction channel by means of negative pressure for producing a holding force. This receiving element is preferably formed from an elastomer in order to, on the one hand, avoid scratching the workpiece and, on the other hand, to enable a quick construction of a vacuum for fixing the workpiece on the lifting pins when applying negative pressure.

The lifting pins are preferably able to be transferred into the retracted and extended positions by a moveable sliding carriage that is arranged in the base body, wherein a work cylinder, in particular a pneumatic cylinder, controls the shifting movement of the sliding carriage. Thus, a vacuum chuck of such a flat construction can be produced, since the shifting movement of the sliding carriage takes place in an XY-plane, whereas the extending movement of the lifting pins is provided in a perpendicular axis, in particular a Z-axis. In addition, the negative-pressure device can, at the same time, also serve to control the work cylinder.

The moveable sliding carriage advantageously has a slanting control surface, along which at least one control element, in particular a cam or a friction or antifriction bearing element is guided, which is fixed on the lifting pin and moves this. Thus, the shifting movement of the sliding carriage can be directly transferred into a lifting movement of the lifting pins.

Furthermore, the lifting pin is preferably guided along a guiding sleeve such that it is able to be shifted, said guiding sleeve being connected to a negative-pressure line or the suction channel in the base body. Thus, a telescope-like construction for the lifting pin is provided, whereby a flat construction of the vacuum chuck can furthermore be achieved. The guiding sleeve is preferably firmly fixed on the base body, and its inner hole ends in the suction channel.

The moveable sliding carriage is preferably positioned in the base body between the clamping plate lying on the base body and an underplate provided on the underside of the base body. This sliding carriage can be glidingly guided between the clamping plate and the underplate, or by means of rollers or balls. Alternatively, the sliding carriage can be held moveably along by guiding elements that are fixed in the base body.

The moveable sliding carriage is preferably provided in the base body in a receiving space on which sensor elements are provided on two end regions opposing each other, said sensor elements detecting the retracted or extended position of the lifting pins depending on the position of the sliding carriage in the receiving space. Thus, monitoring an automatic control of such a vacuum chuck is enabled.

Furthermore, several stopping pins are preferably provided in the base body, said stopping pins being moveable from a retracted position in or below the support surface of the clamping plate into an extended stop position. These stopping pins are used in particular when manually fitting the vacuum chuck with a workpiece, in particular a wafer. If these are not necessary, as is particularly the case with automatically fitting, they can be positioned in or below the support surface of the clamping plate.

The one or more stopping pins are preferably supplied with positive pressure for transferring into the extended stop position. To do so, a supply channel is advantageously provided in each case for the one or more stopping pins, the positive pressure being supplied in said supply channel. Thus, two or more stopping pins, which are provided for a degree of clamping of the workpiece, can be controlled at the same time.

Furthermore, the stopping pins independently adopt the retracted position by venting the supply channel by means of a return spring touching the stopping pin. Thus, it is ensured that, even when a disruption of the pressure supply takes place, the stopping pins do not protrude with respect to the clamping surface of the clamping plate and thus the vacuum chuck can be further used.

Preferably, at least two stopping pins are allocated to every suction groove, said stopping pins being able to be controlled by a common supply channel with positive pressure, wherein these at least two stopping pins are, in each case, arranged radially outside the respective suction groove, which is controlled at least for the corresponding size of the workpiece to be received. Thus, the corresponding stopping pins are allocated to every size of the suction groove such that this vacuum chuck is able to be used for several sizes of workpieces. For example, wafers having a diameter of 4", 6", 8", 10" and/or 12" (inches) can be clamped and checked.

A further advantageous embodiment of the vacuum chuck provides that at least three lifting pins are provided outside a smallest or a first suction groove and, offset relative to these lifting pins seen from the peripheral direction, at least two stopping pins are allocated to the smallest or first suction groove. Thus, all sizes of workpieces to be received for the vacuum chuck are received equally by the lifting pins, lowered onto the support surface and/or lifted up again and similarly, manual fitting is possible because of the positioning of the workpiece on the respective stopping pins.

A further preferred embodiment of the vacuum chuck provides that at least two stopping pins are provided between two adjacent further suction grooves, in each case. The stopping pins arranged in the respective suction groove are preferably aligned in a radial direction along a straight line. Thus, the same handling requirements can be given for different sizes of workpieces to be received on the clamping plate of the vacuum chuck.

The base body of the vacuum chuck preferably has work channels running complementarily relative to the suction grooves, on a side pointing towards the clamping plate, said work channels being connected to at least one suction opening of the respective suction groove in the support surface relative to the clamping plate, and preferably every work channel is controlled separately with a vacuum by a control valve. Thus, an arrangement of such a flat construction and selective control of the respective suction groove are achieved.

In each case, a supply channel is preferably provided in an underplate of the vacuum chuck, said supply channel being connected to a respective feed channel in the base plate, wherein the supply channel supplies at least two lifting pins with positive pressure at the same time. This similarly enables a compact arrangement of the vacuum chuck with a small construction height.

The object of the invention is furthermore solved by a measuring device for checking workpieces, in particular wafers, with X-ray fluorescent radiation, in which a vacuum chuck according to one of the embodiments described above is provided on a moveable measuring table of the measuring device. Because of the small construction height, such a vacuum chuck can be used in existing X-ray fluorescent measuring devices. Furthermore, a simple adjustment to different measuring objects and materials of the workpieces to be checked can be enabled because of the selection of the material for the base plate. Thus, corresponding vacuum chucks can be exchanged or the clamping plates can be able to be exchanged with a different material and are able to be fixed to the base body of the vacuum chuck.

The object of the invention is further solved by a method for checking a workpiece, in particular a wafer, with X-ray fluorescent radiation, in which the following steps are provided in particular:

The vacuum chuck is activated by a workpiece before fitting. Thus, lifting pins are transferred into an extended position with respect to the support surface of the clamping plate. Subsequently, the workpiece to be checked can be placed on the lifting pins by a handling device and a negative pressure can be applied to the lifting pins in order to fix the workpiece to be checked to the lifting pins. Subsequently, the handling device can be guided out of the measuring device. The lifting pins are controlled by a shifting movement such that these are transferred into a retracted position and the workpiece is placed on the support surface. Then at least the outermost suction groove is supplied with negative pressure corresponding to the size of the workpiece and the workpiece is clamped on the support surface. After the workpiece has been checked by means of X-ray fluorescent radiation, the negative pressure is shut off by the at least one suction groove supplied with it, and the lifting pins are transferred into the extended position. Subsequently, the workpiece is grasped by the handling device and the negative pressure on the lifting pins is shut off. The workpiece can then be removed from the measuring device by means of the handling device.

Preferably, the negative pressure applied to the lifting pins can also be retained on the support surface of the clamping plate during the clamping of the workpiece. Alternatively, it can also be switched off at the point in time of clamping the workpiece on the support surface.

The invention and further advantageous embodiments and developments of the same are described and explained below in more detail by means of examples presented in the drawings. The features that can be ascertained from the description and the drawings can be applied individually or together in any combination according to the invention. Here are shown:

Figure 1:
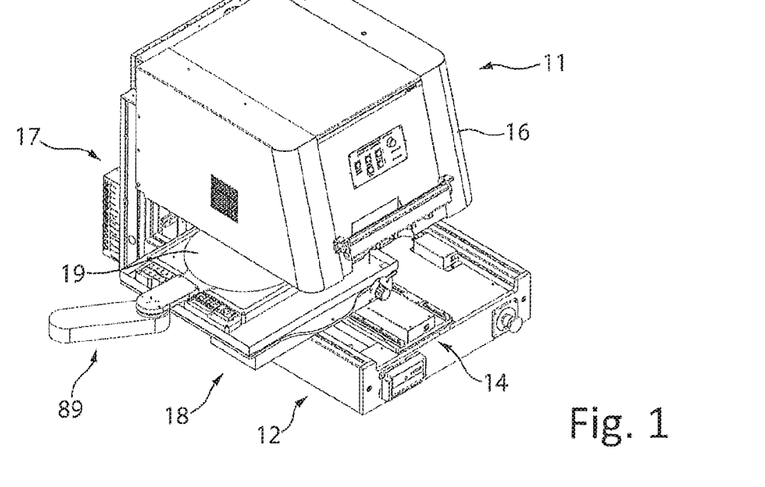
FIG. 1 a perspective view of an X-ray fluorescent measuring device having a vacuum chuck, FIG. 2 a schematic view from above of the vacuum chuck according to FIG. 1, FIG. 3 a schematic sectional view of the vacuum chuck along line II-II in FIG. 2, FIG. 4 a schematically enlarged view of detail B in FIG. 3, FIG. 5 a schematically enlarged view of detail C in FIG. 3, FIG. 6 a perspective view of the vacuum chuck with a raised clamping plate, FIG. 7 a schematic view from above of the base body of the vacuum chuck, FIG. 8 a schematic view from below of the base body of the vacuum chuck with a raised underplate, FIG. 9 a perspective detailed view of detail D in FIG. 3, FIG. 10 a schematically enlarged view of a lifting pin according to detail D in FIG. 3, FIG. 11 a schematic sectional view along line XI-XI in FIG. 9, FIG. 12 a schematic view from below of an underplate of the base body of the vacuum chuck with a raised covering plate, FIG. 13 a schematic sectional view along line XII-XII in FIG. 12, FIG. 14 a perspective view of the vacuum chuck in a working position during an automatic fitting with a workpiece, FIG. 15 a perspective view of a vacuum chuck with a received workpiece, FIG. 16 a perspective view of a working position of the vacuum chuck for manually fitting a workpiece, and FIG. 17 a perspective view of a manually fitted workpiece on the vacuum chuck.

A measuring device 11 for carrying out a measurement by means of X-ray fluorescent radiation is depicted perspectively in FIG. 1. This measuring device 11 comprises a measuring table 12 which is moveable, for example, in an XY plane by means of a linear axis system 14. A radiation source for producing primary radiation and one or more diverting elements for guiding the primary X-ray radiation onto a workpiece 19 lying on the measuring table 12, which are not depicted in more detail, are inside a housing 16 of the measuring device 11. Furthermore, the measuring device 11 in the housing 16 comprises a detector, by means of which the secondary radiation that is limited by the workpiece 19 is detected. This detector is connected to a control device 17 in order to evaluate the detected measuring signals and advantageously display them via a display.

A vacuum chuck 18 according to the invention, which is described in more detail in the figures below, serves to receive and clamp workpieces 19, in particular wafers. This vacuum chuck 18 can be mounted or fixed on the measuring table 12 of the measuring device 11 in order to fix the workpiece 19, in particular the wafer, for checking, for example by means of X-ray fluorescent radiation. This workpiece 19 can be placed on the vacuum chuck 18 by a handling device 89, for example.

Figure 2:
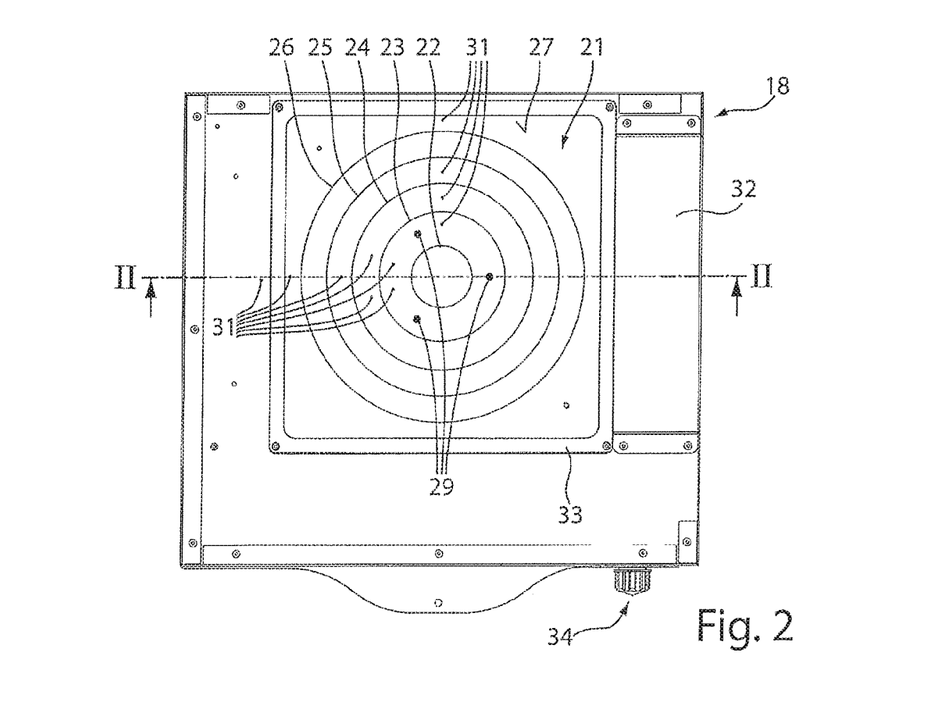

In FIG. 2, a schematic view from above of the vacuum chuck 18 is depicted. This comprises a clamping plate 21 having a support surface 27 which comprises several suction grooves 22, 23, 24, 25, 26. These suction grooves 22 to 26 are formed by a circular indentation which is introduced into the support surface 27 of the clamping plate 21. Preferably, the suction grooves 22 to 26 are arranged concentrically relative to one another. The number of suction grooves 22 to 26 can be adjusted for the measuring object depending on the size of the clamping plate 21 and/or the workpiece 19 to be received.

Furthermore, the vacuum chuck 18 comprises lifting pins 29, for example three lifting pins 29. These are preferably arranged between the first suction groove 22 and the second suction groove 23. In particular, these are arranged to be evenly distributed across the periphery. The lifting pins 29 are preferably made from precious metal.

The vacuum chuck 18 can furthermore have stopping pins 31, wherein at least two stopping pins 31 can be allocated to every suction groove 22 to 26 in order to achieve positioning and alignment of the workpiece 19. The stopping pins 31 are arranged to be offset with respect to one another, for example, in particular offset with respect to one another at an angle of 90°. For two smaller sizes of workpieces 19 to be received, three stopping pins 31 are, for example, allocated to the first suction groove 22 and the second suction groove 22 in each case, wherein two stopping pins 31 lie on a common straight line in order to obtain additional alignment on a stopping surface of the workpiece 19.

The vacuum chuck 18 comprises a base body 33 which receives the clamping plate 21. The clamping surface 21 can be provided to be fixed on the base body, for example by adhesion, screwing or riveting. Alternatively, the clamping plate 21 can also be provided exchangeably on the base body 33. To do this, detachable fixing elements are preferably provided. The clamping plate 21 can consist of different materials and be selected according to the measuring object.

An actuator 34 is provided on a front face of the vacuum chuck 18, said actuator controlling a multi-position valve that is not depicted in more detail, in order to correspondingly activate the individual stopping pins 31 according to the size of the workpieces 19 to be clamped. This is described in more detail below. Several connections 43 are provided under a covering 32, said connections being discussed by means of FIGS. 7 and 8 below.

Figure 3:
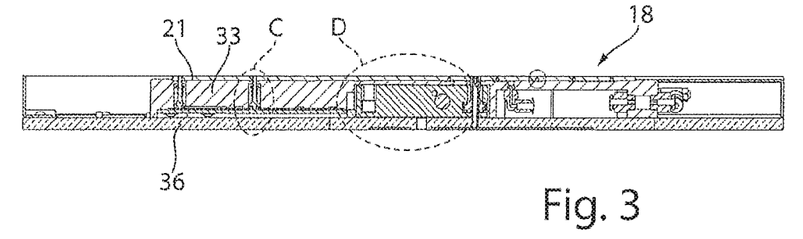
Figure 4:
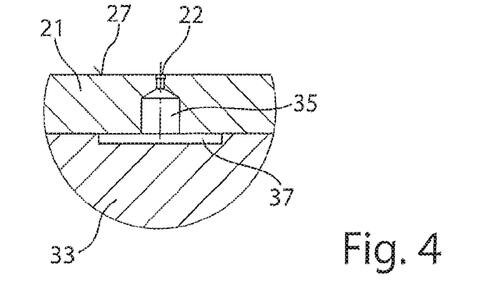
Figure 6:
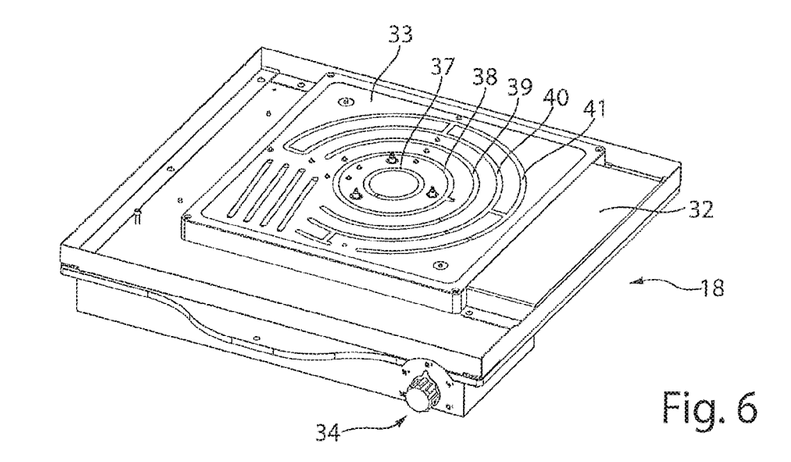

In FIG. 3, a schematic sectional view along the line II-II in FIG. 2 is depicted. The construction in principle of the vacuum chuck 18 emerges from this. The clamping plate 21 is on an upper side of the base body 33. An underplate 36 is fixed on an underside of the base body 33. Work channels 37, 38, 39, 40, 41 (FIG. 6) for controlling the suction grooves 22 to 26 are located between the clamping plate 21 and the base body 33. These work channels 37 to 41 are, by way of example, depicted enlarged in cross-section in FIG. 4, and in a perspective view from above in FIG. 6, wherein FIG. 6 depicts a perspective view of the base body 33 in the case of a removed clamping plate 21. The work channels 37 to 41 are preferably introduced into the surface of the base body 33. Alternatively, these can also be introduced into the underside of the clamping plate 21. The suction grooves 22 to 26 are provided on the upper side of the clamping plate 21. These are formed to be rectangular, for example, and extend only slightly from the support surface 27 in the direction of the base body 33. At least one suction opening 35 is respectively provided at least between each work channel 37 to 41 and each suction groove 22 to 26 that is allocated to the work channel 37 to 41 to connect the suction grooves 22 to 26 to the work channels 37 to 41. This detail B according to FIG. 3 is depicted enlarged in FIG. 4.

Figure 5:
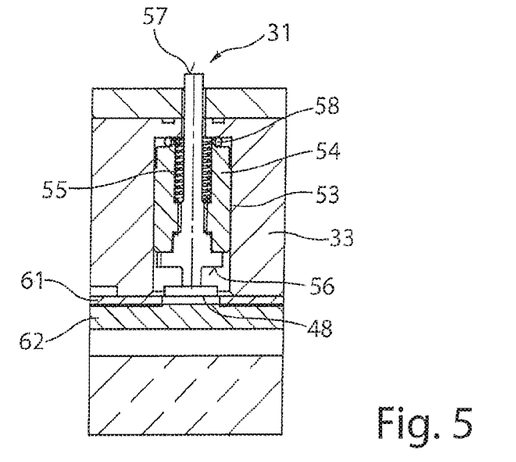

Detail C in FIG. 3 is depicted schematically enlarged in FIG. 5, wherein the stopping pins 31 are depicted in a retracted position in FIG. 3 and enlarged in an extended position in FIG. 5. The stopping pin 31 is received in a receiver 53 in the base body 33, wherein the stopping pin 31 is inserted into a piston 54. The piston 54 is shiftably guided in the receiver 53. A return spring 55 is arranged between the stopping pin 31 and the piston 51. This ensures that, when the pressure surface 56 on the stopping pin 31 is not supplied with positive pressure, the stopping pin 31 is transferred into a retracted position. Thus, a front face 57 of the stopping pin 31 is in the support surface 27 of the clamping plate 21 or below. The receiver 54 is supplied with positive pressure to produce and maintain an extending movement of the stopping pin 31, said positive pressure acting on the pressure surface 56. A blow-out through an opening in the base body 33 and in the clamping plate 21 is prevented by a gasket 58, the stopping pin 31 extending through said opening. A supply channel 48 for the positive pressure is sealed with respect to adjacent supply channels 49, 50, 51 (FIG. 7) by a sealing mat 61 which is fixed to the base body 33 by means of an intermediary plate 62 by clamping. The stopping pin 31 is preferably produced from precious metal.

A perspective view of the base body 33 in a removed clamping plate 21 is depicted in FIG. 6. From this, the courses of the individual work channels 37, 38, 39, 40, 41 are able to be seen, which extend below the suction grooves 22 to 26. By introducing the work channels 37 to 41 into the base plate 33, a flat construction can be created in order to supply the suction grooves 22 to 26 with negative pressure.

Figure 7:
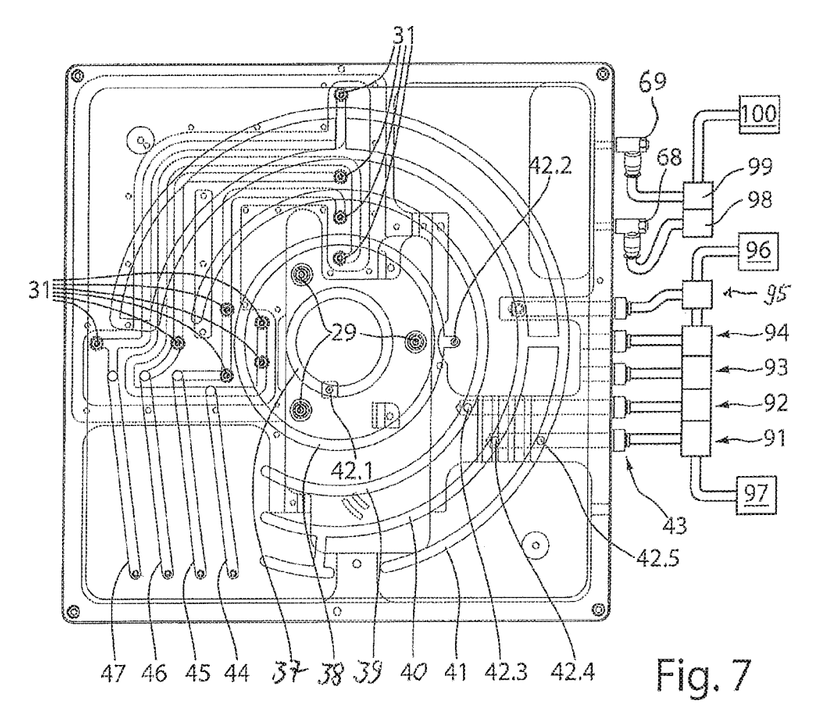

It can be seen in FIG. 7 that one connection hole 42, 42.1, 42.2, 42.3, 42.4 and 42.5 is allocated to every work channel 37 to 41, said connection hole respectively leading to a connection piece 43, to which a negative-pressure line is respectively able to be connected. Alternatively, the connection holes 42.4 and 42.5 can lead to a connection piece 43. Each of these connection pieces 43 is separately connected to a control valve 91, 92, 93, 94 and is separately controlled by this control valve 91 to 94. A control 96 is provided to control these control valves 91 to 94. Each of these control valves 91 to 94 is separately controlled by the control 96. This control 96 can be connected to the control device 17. The work channels 37 to 41 are supplied with negative pressure by a negative-pressure device 97.

Figure 13:
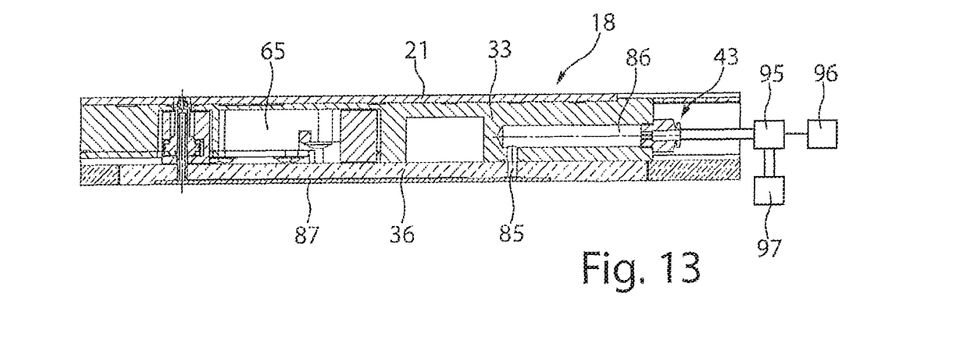

Furthermore, a connection piece 43 is provided on the base body 33, which is controlled by the control valve 95. This control valve 95 regulates the applying of the negative pressure to the lifting pins 29. This is described in more detail in FIG. 13. This control valve 95 is also switched by the control.

Furthermore, on an upper side of the base body 33, four feed channels 44 to 47 are provided, through which, respectively, a positive pressure can be guided into a supply channel 48 to 51 connected thereto. These supply channels 48 to 51 can be controlled by the multi-switch valve which is selected by means of the operating element 34. These supply channels 48 to 51 are supplied with positive pressure by a positive pressure device. This can be carried out by a separate positive pressure device or even by correspondingly controlling the negative-pressure device 97.

At least two stopping pins 31 are allocated to every supply channel 48 to 51. For example, the feed channel 44 ends in the supply channel 48, in which in total three stopping pins 31, for example, can be controlled, which are arranged between the first suction groove 22 and the second suction groove 23 or the corresponding work channel 37, 38. This feed channel 44 is supplied with compressed air, for example, if a workpiece 19, in particular a wafer, with a diameter of 4" (4 inches) is to be placed and clamped. The feed channel 45 is supplied for a 6" wafer, the feed channel 46 for an 8" wafer and the feed channel 47 for a 12" wafer.

The course of the feed channels 44 to 47 and supply lines 48 to 51 are also clear from the view of the base body 33 from below according to FIG. 8.

In the region of the feed channels 44 to 47, the work channels 39 to 41 in the base body 33 are indeed interrupted; however, applying a vacuum in these regions is sufficient to obtain a circular vacuum in each case inside the corresponding suction grooves 22 to 26, whereby a flat support of the workpiece 19 on the support surface 27 of the clamping plate 21 is provided.

Figure 8:
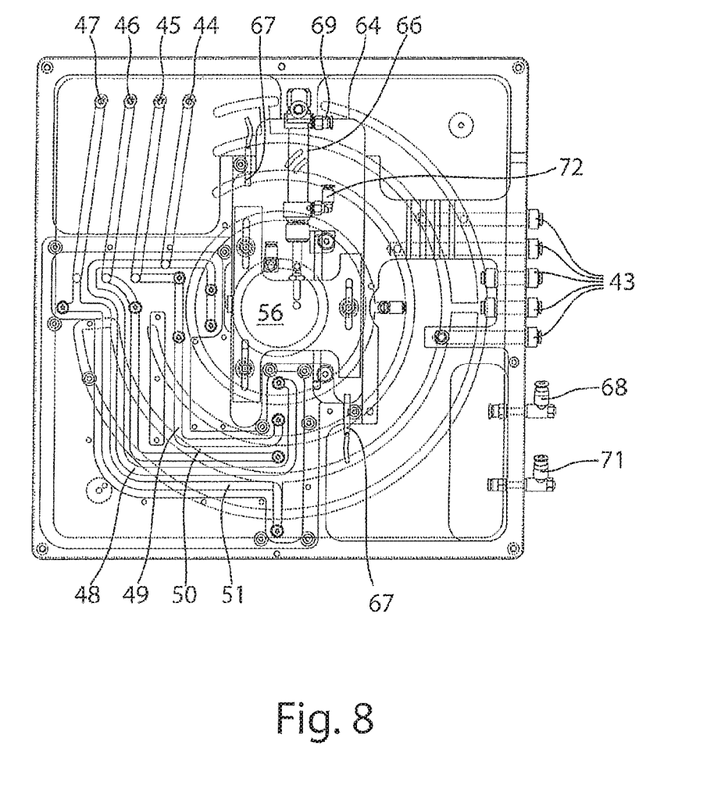

A receiving space 64 in the base body 33 arises from FIG. 7 as well as FIG. 8, in which a moveable sliding carriage 65 is arranged, as is depicted in particular in FIG. 8. This sliding carriage 65 receives the three lifting pins 29. By means of a shifting movement of the sliding carriage 65, which is controlled by a cylinder 66, in particular a pneumatic cylinder, the lifting pins 29 are transferred from a retracted position into an extended position. A connection 68 is connected to a connection 69 on the cylinder 66 to control the cylinder 66. The connections 71 and 72 are connected to each other to control an opposing shifting movement. These connections 68, 71 are in each case controlled by a control with a control valve 98, 99 or by a common control valve corresponding to the desired shifting movement. The cylinder 66 is supplied with positive pressure via a pressure device 100.

The supply and waste air of the cylinder 66 is regulated via the control valves 98, 99. The cylinder 66 can have an adjustable end position damping. Thus, a gentle lifting and lowering of the lifting pins 29 for placing and lifting the workpiece 19 on the support surface 27 of the clamping plate 21 can be adjusted and enabled. The connections 68, 69, by means of which the control valves 98, 99 are connected in the vacuum chuck 18 in order to supply the supply air for the cylinder 66, comprise one-way-restrictors in order to restrict at least the waste air.

Sensor elements 67 are arranged opposite one another to detect the position of the respective retracted or extended position of the lifting pins 29. These detect the position of the sliding carriage 65 in the receiving space 64 and convey the signals to the control 96 and/or the control device 17. The position of the lifting pins 29 is also detected from the position of the sliding carriage 65 because of the forced guiding of the lifting pins 29.

Figures 9, 10:
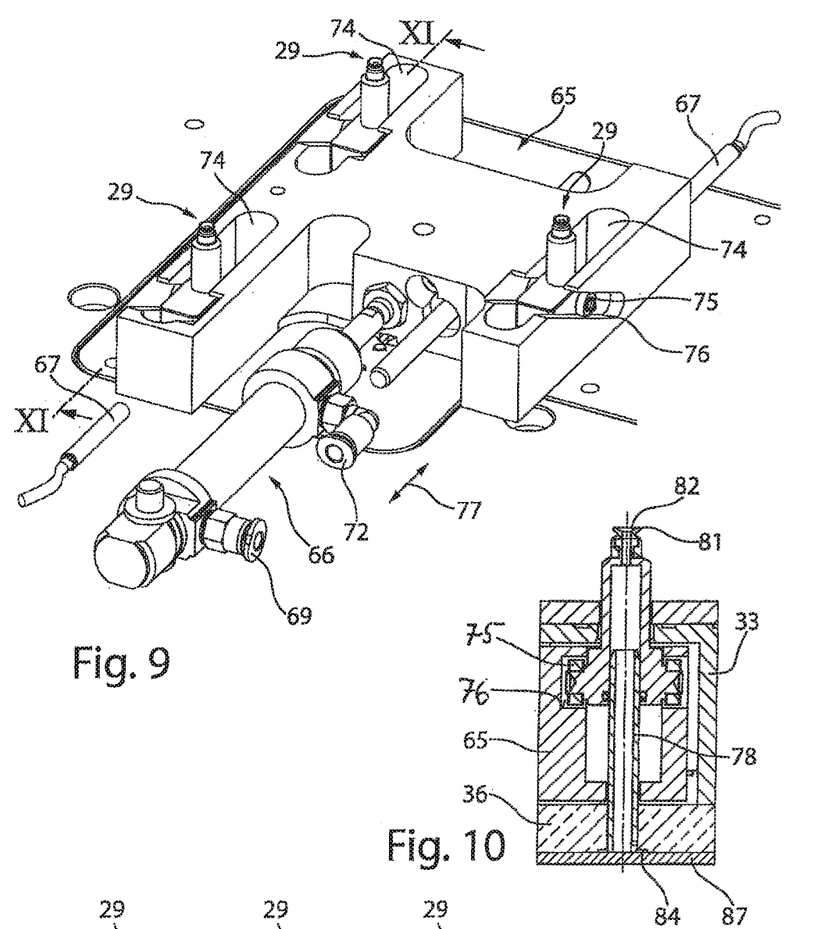
Figure 11:
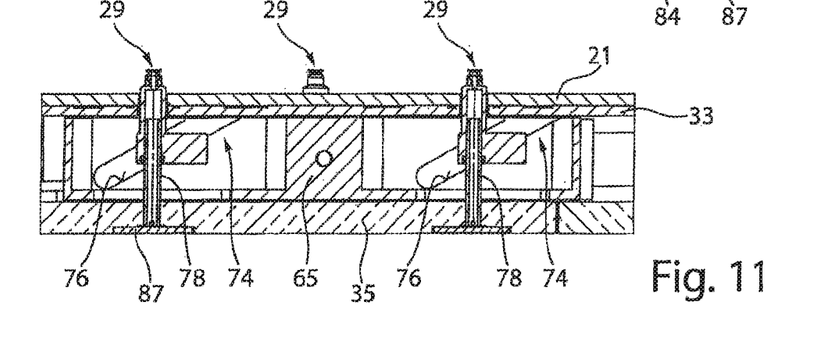

A perspective view of the sliding carriage 65 with the lifting pins 29 is depicted in FIG. 9. FIG. 10 shows a first sectional view of the lifting pins 29. FIG. 11 shows a further sectional view along the line XI-XI in FIG. 9.

The sliding carriage 65 is preferably approximately H-shaped, wherein longitudinal indentations 74 are provided in a leg, the lifting pins 29 being moveable inside said indentations. The lifting pin 29 is connected to at least one control element 75, in particular a cam, a friction or antifriction bearing, which is moveable along a slanted control surface 76. A shifting movement of the sliding carriage 65 in an XY-plane or according to arrow 77 produces an extending and retracting movement of the lifting pins 29 which is aligned perpendicular to said plane. Thus, the lifting pin 29 is guided to be vertically moveable along a guiding sleeve 78 such that this is able to be transferred from a retracted position into an extended position that is depicted in FIG. 10 and FIG. 11. All three lifting pins 29 are able to be moved up and down at the same time by the shifting movement of the sliding carriage 65.

Figure 12:
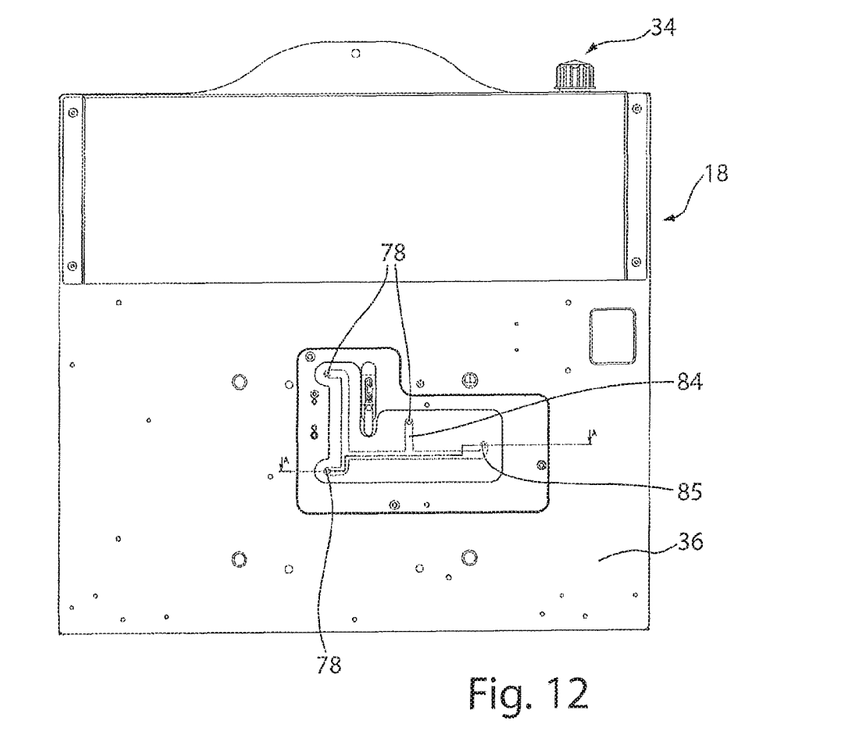

On its upper end, the lifting pin 29 has a receiving element 81 that is similar to a suction cup, which is preferably formed from plastic. A hole 82 is provided inside the receiving element 81, said hole aligning with the guiding sleeve 78 such that a negative pressure produced by the guiding sleeve 78 also abuts on the receiving element 81. With a supporting workpiece 19, this is fixed to the support element 81. The guiding sleeve 78 and the lifting pins 29 are connected to one another by a common suction channel 84. Such a suction channel 84 is illustrated in the view from below of the underplate 36 in FIG. 12. The branches depicted there show that a connection to the respective guiding sleeve 78 is provided on the respective ends of the suction channel 84. A negative pressure is produced in the suction channel 84 by a negative-pressure device 97, for example, via a connection hole 85 and a branch channel 86. Applying and switching off the vacuum is regulated by the control 96 and the control valve 95. The work channel 84 is preferably introduced into the underplate 36 and this is in turn sealed with a separate covering plate 87.

Figure 14:
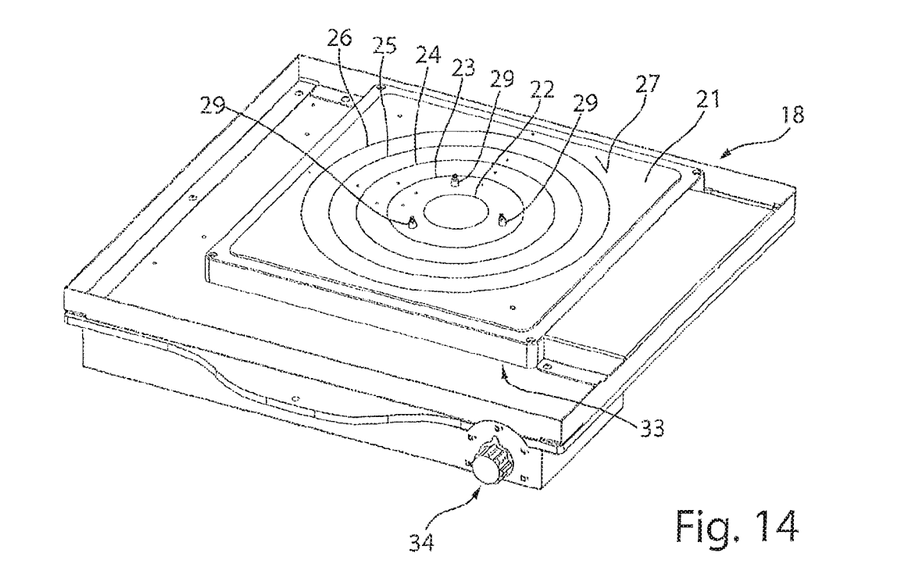
Figure 15:
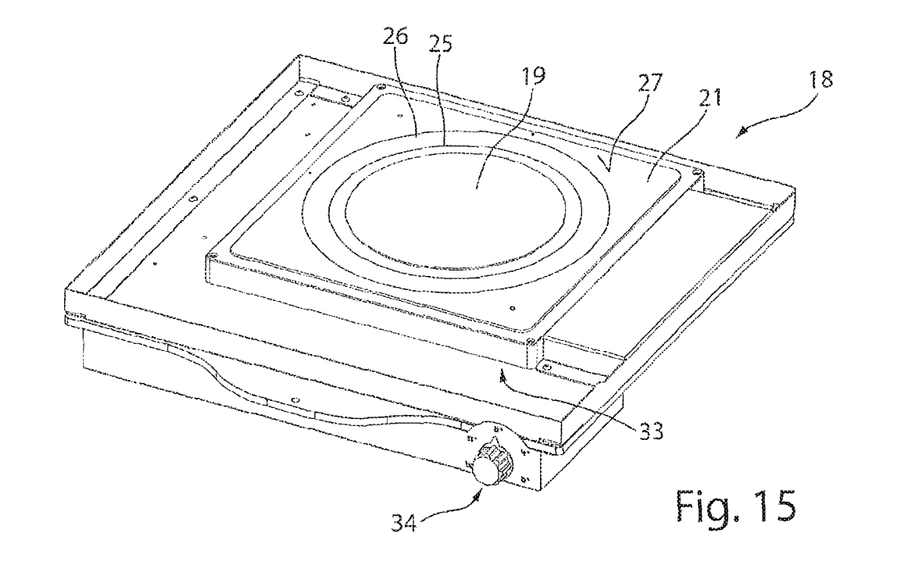

Taking FIG. 1 and FIGS. 14 and 15 into account, an automatic fitting and checking of a workpiece 19 is described below.

The workpiece 19 is grasped by a handling device 89 according to FIG. 1 from a magazine not depicted in more detail or a feed device and is supplied to the measuring device 11. The sliding carriage 65 is moved in the vacuum chuck 18 by the cylinder 66 such that the lifting pins 29 are transferred from a retracted position into the extended position depicted in FIG. 14. This extended position is also depicted in FIG. 10, for example. Subsequently, the workpiece 19 is placed, preferably in an exact position, on the receiving elements 81 of the lifting pins 29 by means of the handling device 89. Subsequently, a negative pressure is applied to the lifting pins 29 such that the workpiece 19 is fixed to the lifting pins 29 because of the vacuum. Subsequently, the handling device 89 is guided out of the measuring device 11.

Subsequently, the cylinder 66 is controlled again in order to transfer the sliding carriage 65 into a further position, such that the lifting pins 29 are lowered and retracted. This can take place by at least one of the control valves 98, 99 and be monitored by the sensor elements 67. The workpiece 19 comes to rest gently on the support surface 27 of the clamping plate 21. Before or during, if appropriate also after lowering, the respectively provided suction groove 22 to 26 is supplied with a vacuum corresponding to the size of the workpiece 19, such that the workpiece 19 is fixed to the clamping plate 21. The workpiece 19, according to FIG. 15, is an 8" wafer, for example. At this point, when the workpiece 19 is fixed to the clamping plate 21, the negative pressure in the lifting pins 29 can be shut off by the control 96. This can also further remain constant. Subsequently, checking and/or measuring the workpiece 19 takes place by means of X-ray fluorescent radiation. After finishing checking and/or measuring, the vacuum in the corresponding suction groove 22 to 26 is released and, if the vacuum in the lifting pins 29 has been switched off, this is activated again and switched on before releasing the vacuum in the suction groove 22 to 26. A shifting movement of the sliding carriage 65 follows on from this such that the workpiece 19 is again lifted with respect to the support surface 27. Subsequently, the handling device 89 is again retracted into the measuring device 11. In particular, this reaches under the workpiece 19. After switching off the vacuum on the lifting pins 29, the workpiece 19 can be guided out of the measuring device 11 and stacked or fed for further processing.

At least the suction groove 24 is supplied with a vacuum. Preferably, the smaller suction grooves 23 and/or 22 are also supplied with a vacuum. The suction grooves 25 and 26 are thus not supplied with a vacuum since these are not covered by the workpiece 19.

Figure 16:
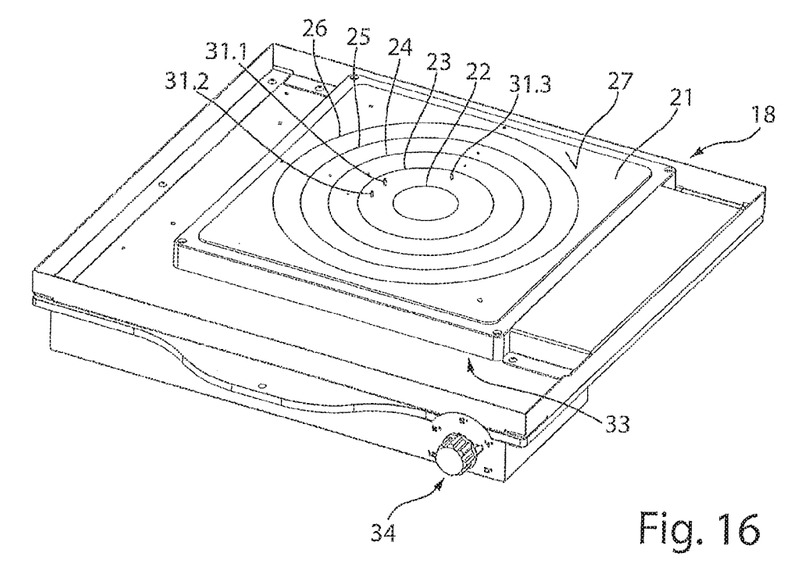
Figure 17:
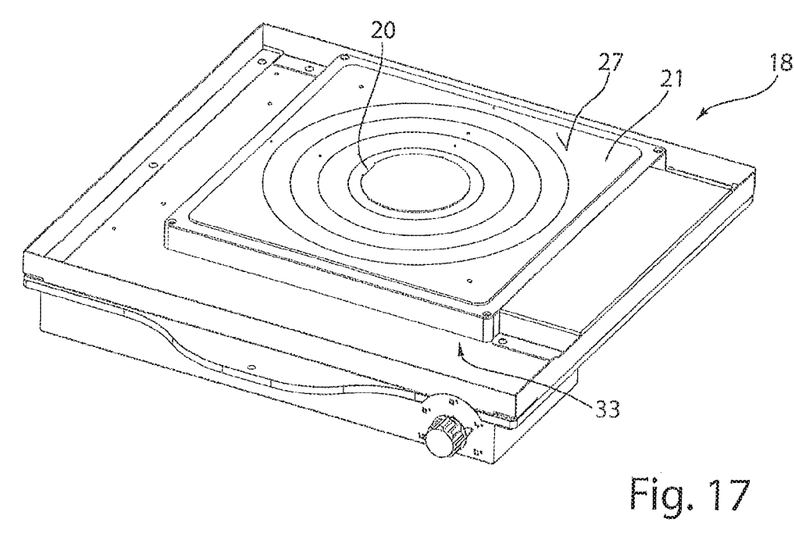

The positioning and placing of a workpiece by hand, i.e. a manual operation, is described by FIGS. 16 and 17. To check a workpiece 19 according to FIG. 17, which is a 4" wafer for example, the operating element 34 is initially adjusted to 4". Then the feed channel 44 and the supply channel 48 are supplied with compressed air via the multi-switch valve, whereby the stopping pins 31.1, 31.2, 31.3 allocated to the suction groove 22 are extended. Subsequently, the workpiece 19 can be placed on the two adjacently allocated stopping pins 31.1 and 31.2 with its flat section 20 and aligned with the third stopping pin 31.3. At the same time as extending the stopping pins 31, a vacuum can be produced in the suction groove 22. This can, however, also only take place after placing the workpiece 19 and its alignment with respect to the stopping pins 31.1, 31.2, 31.3. To remove the workpiece 19, the vacuum is initially switched off in the corresponding suction groove 22 to 26, in suction groove 22 in the exemplary embodiment. Then the workpiece 19 can by manually removed. Alternatively, there is the possibility of the lifting pins 29 being controlled in order to lift the workpiece 19 with respect to the support surface 27 in order to enable an easier removal.

The invention claimed is:

1. A method of making a vacuum chuck for checking a wafer in an X-ray fluorescent analyzer, the method comprising:

selecting a material for a clamping plate of the vacuum chuck which is configured to hold the wafer during analysis in the X-ray fluorescent analyzer, wherein the material of the clamping plate is selected based on the material and dimensions of the wafer to be checked such that when primary X-ray radiation is directed at the wafer and travels through the wafer and impinges the clamping plate, a secondary scattered radiation is produced by the clamping plate in an amount that the secondary scattered radiation is absorbed by the wafer; and forming the clamping plate from the material, such that the clamping plate has a support surface, the clamping plate having at least one suction connection arranged on a base body, said suction connection connecting to a negative-pressure device, said negative-pressure device clamping the wafer on the clamping plate by way of negative pressure which is received by the base body, and wherein several suction grooves are arranged in the clamping plate, such that said suction grooves are open towards the support surface, the support surface having several concentric suction grooves, each suction groove having at least one suction opening to which a negative-pressure line, or work channel, is connected, wherein each suction groove is configured to have a negative pressure that is separate from the negative pressure of an adjacent suction groove.

2. The method according to claim 1, wherein the material of the clamping plate is selected based on the material and dimensions of the wafer to be checked such that essentially all of the secondary scattered radiation is absorbed by the wafer.

3. The method according to claim 1, wherein the material of the clamping plate is selected based on the material and dimensions of the wafer to be checked such that essentially none of the secondary scattered radiation reaches a detector of the X-ray fluorescent analyzer.

4. The method according to claim 1, wherein the material of the clamping plate is selected based on the material and dimensions of the wafer to be checked such that 20% to 80% of the secondary scattered radiation is absorbed by the wafer.

5. The method according to claim 1, wherein the material of the clamping plate is selected based on the material and dimensions of the wafer to be checked such that only 20% to 80% of the secondary scattered radiation reaches a detector of the X-ray fluorescent analyzer.

6. The method according to claim 1, wherein the clamping plate is formed such that lifting pins are provided in the base body, the lifting pins being moveable between a retracted position, in which the lifting pins are in or below the support surface of the clamping plate, and an extended position, in which the lifting pins extend above the support surface, and wherein the lifting pins each have a receiving element which comprises a central hole that is connected to a suction channel to produce a holding force at the receiving element by way of negative pressure.

7. The method according to claim 6, wherein the clamping plate is formed such that a moveable sliding carriage is provided in the base body for controlling the retractable or the extendable position of the lifting pins, and for transferring the lifting pins into the retracted position and into the extended position, the moveable sliding carriage having slanted control surfaces, wherein, along said control surfaces, at least one control element is guided such that it is moveable, said control element being connected to the lifting pin.

8. The method according to claim 6, wherein the clamping plate is formed such that each of the lifting pins is guided along a guiding sleeve such that each lifting pin is shiftable, said guiding sleeve being connected to the suction channel in the base body for producing a negative pressure.

9. The method according to claim 6, wherein the clamping plate is formed such that a moveable sliding carriage is positioned in the base body between the clamping plate lying on the base body and an underplate arranged on the underside of the base body.

10. The method according to claim 6, wherein the clamping plate is formed such that a moveable sliding carriage is arranged in a receiving space of the base body and two opposing sensor elements are allocated to the receiving space, whereby the adoption of the retracted or extended position of the lifting pins is detectable depending on the position of the sliding carriage in the receiving space.

11. The method according to claim 6, wherein the clamping plate is formed such that the clamping plate further comprises several stopping pins provided in the base body, wherein said stopping pins are moveable from a retracted position in or below the support surface into an extended position above the support surface of the clamping plate.

12. The method according to claim 11, wherein the clamping plate is formed such that one or more stopping pins for transferring into an extended stopping position are connected to at least one supply channel which is supplied with positive pressure and the stopping pins independently adopt the retracted position by venting the respective supply channel that is connected to the at least one stopping pin and by way of a return spring touching the stopping pin.

13. The method according to claim 11, wherein the clamping plate is formed such that at least two stopping pins are allocated to every suction groove, said stopping pins configured to be controlled by positive pressure by one common supply channel.

14. The method according to claim 6, wherein the clamping plate is formed such that three lifting pins are provided outside the smallest or first suction groove, and at least two stopping pins are provided offset relative to the three lifting pins.

15. The method according to claim 11, wherein the clamping plate is formed such that at least two stopping pins are provided between two suction grooves, wherein at least one of the at least two stopping pins is adjacent to one of the two suction grooves.

16. The method according to claim 6, wherein the clamping plate is formed such that work channels that run complementarily to the suction grooves are provided on a side of the base body pointing towards the clamping plate, said work channels being connected to the at least one suction opening with the suction grooves in the support surface of the clamping plate and wherein every work channel is controlled separately by vacuum by a control valve.

17. The method according to claim 12, wherein the clamping plate is formed such that supply channels are provided in an underplate, said supply channels being respectively connected to a feed channel, through which at least two stopping pins, which are allocated to the size of the wafer, are simultaneously supplied with positive pressure.

18. A vacuum chuck for X-ray fluorescent analysis of a wafer, the vacuum chuck comprising:
a clamping plate having a support surface, the clamping plate having at least one suction connection arranged on a base body, said suction connection connecting to a negative-pressure device, said negative-pressure device clamping the wafer on the clamping plate by way of negative pressure which is received by the base body, and wherein several suction grooves are arranged in the clamping plate, such that said suction grooves are open towards the support surface, the support surface having several concentric suction grooves, each suction groove having at least one suction opening to which a negative-pressure line, or work channel, is connected, wherein each suction groove is configured to have a negative pressure that is separate from the negative pressure of an adjacent suction groove;
wherein a material of the clamping plate is selected based on the material and dimensions of the wafer to be checked such that when primary X-ray radiation is directed at the wafer and travels through the wafer and impinges the clamping plate, a secondary scattered radiation is produced by the clamping plate in an amount that the secondary scattered radiation is absorbed by the wafer.

19. A method of checking a wafer in an X-ray fluorescent analyzer, comprising:
providing a vacuum chuck comprising a clamping plate having a support surface, the clamping plate having at least one suction connection arranged on a base body, said suction connection being configured to clamp the wafer on the clamping plate by way of negative pressure, wherein several suction grooves are arranged in the clamping plate, such that said suction grooves are open towards the support surface, the support surface having several concentric suction grooves, each of the several concentric suction grooves having at least one suction opening to which a negative-pressure line, or work channel, is connected; wherein a material of the clamping plate is selected based on the material and dimensions of the wafer to be checked such that when primary X-ray radiation is directed at the wafer and travels through the wafer and impinges the clamping plate, a secondary scattered radiation is produced by the clamping plate in an amount that the secondary scattered radiation is absorbed by the wafer;

providing the wafer to be checked;

holding the wafer on the vacuum chuck in the X-ray fluorescent analyzer;

directing primary X-ray radiation at the wafer, whereby at least some of the primary X-ray radiation travels through the wafer and impinges the clamping plate;

generating an amount of secondary scattered radiation by the clamping plate in response to the primary X-ray radiation that impinges the clamping plate; and absorbing the amount of secondary scattered radiation by the wafer.

20. The method according to claim 19, wherein 20% to 80% of the secondary scattered radiation is absorbed by the wafer.

* * * * *